United States Patent [19]
Ohlig et al.

[11] Patent Number: 5,386,268
[45] Date of Patent: Jan. 31, 1995

[54] EXPOSURE UNIT AND METHOD FOR EXPOSING PHOTOSENSITIVE MATERIALS

[75] Inventors: Albert H. Ohlig, Costa Mesa; Steven W. Nelson, Orange, both of Calif.; Robert J. Verbiar, West Chester, Pa.; Stephen Cushner, Lincroft, N.J.

[73] Assignee: E.I. du Pont de Nemours and Company, Wilmington, Del.

[21] Appl. No.: 97,145

[22] Filed: Jul. 26, 1993

[51] Int. Cl.⁶ .............................................. G03B 27/54
[52] U.S. Cl. ............................................ 355/70; 355/84
[58] Field of Search ............... 355/84, 97, 108, 119, 355/233, 50, 51, 71, 67

[56] References Cited
U.S. PATENT DOCUMENTS

| | | | |
|---|---|---|---|
| 4,085,976 | 2/1982 | Gibson, Jr. et al. | 430/306 |
| 4,372,679 | 2/1983 | Weber | 355/70 |
| 4,380,390 | 4/1983 | Tateoka et al. | 355/71 |
| 4,445,774 | 5/1984 | Spinelli et al. | 355/71 |
| 4,811,057 | 3/1989 | Murakami et al. | 355/71 |
| 4,922,078 | 5/1990 | Ulrich et al. | 219/216 |
| 4,987,445 | 1/1991 | Burgess et al. | 355/84 |

*Primary Examiner*—Richard A. Wintercorn
*Attorney, Agent, or Firm*—Thomas H. Magee

[57] ABSTRACT

An exposure unit and method for imaging a photosensitive material includes a source of radiation for exposing the photosensitive material to actinic radiation such that the radiation strikes the photosensitive material at a plurality of angles of incidence, and apparatus for moving the radiation source relative to and in a plane parallel to the photosensitive material. The exposure unit also has a reflector for controlling (1) the proportion of (a) radiation having perpendicular angles of incidence to (b) radiation having non-perpendicular angles of incidence, such that the radiation having non-perpendicular angles is increased, and (2) the distribution of non-perpendicular angles of incidence.

13 Claims, 4 Drawing Sheets

EXPOSURE UNIT AND METHOD FOR EXPOSING PHOTOSENSITIVE MATERIALS

BACKGROUND OF THE INVENTION

1. Field of the Invention

This invention pertains to an exposure unit for imaging photosensitive materials, particularly photosensitive materials used to form flexographic printing plates, and to a method for uniformly exposing photosensitive materials.

2. Description of the Prior Art

Flexographic printing plates are elastomeric plates which generally have a relief depth in the range of 10 to 150 mils. Processes for producing flexographic printing plates from a photosensitive element are well known in the art. Typically, these processes include (1) exposing imagewise a photopolymerizable element to actinic radiation to produce a difference in solubility between the exposed and non-exposed areas, (2) removing the more soluble areas with a developer solvent, and (3) drying the resulting plate. The process usually also includes (4) exposing to a "backflash" exposure, (5) detackifying and (6) post-exposing overall.

The three exposure steps, i.e., backflash, imagewise exposure, and post-exposure, can be accomplished using actinic radiation from a variety of sources such as, for example, lamps. Exposure times vary from a few seconds to a few minutes depending upon the output of the lamps, distance from the lamps, relief depth desired and the thickness of the plate.

Exposure units which are currently used in the production of flexographic printing plates have several disadvantages. The exposure units require long exposure times which adversely affects productivity. Also, they are not capable of consistently providing a uniform distribution of radiation, particularly to large plates. In addition, the current exposure units are not capable of creating the type of relief profile required for very high-resolution printing.

SUMMARY OF THE INVENTION

The present invention provides an exposure unit for imaging a photosensitive material comprising:
a source of radiation for exposing the photosensitive material to actinic radiation such that the radiation strikes the photosensitive material at a plurality of angles of incidence;
apparatus for moving the radiation source relative to and in a plane parallel to the photosensitive material; and
means for controlling (1) the proportion of (a) radiation having perpendicular angles of incidence to (b) radiation having non-perpendicular angles of incidence, such that the radiation having non-perpendicular angles is increased, and (2) the distribution of non-perpendicular angles of incidence.

The present invention also provides a method for imaging a photosensitive material comprising:
exposing imagewise the photosensitive material to actinic radiation from a radiation source such that the radiation strikes the photosensitive material at a plurality of angles of incidence, and at the same time moving the radiation source relative to and in a plane parallel to the photosensitive material; and
controlling (1) the proportion of (a) radiation having perpendicular angles of incidence to (b) radiation having non-perpendicular angles of incidence, such that the radiation having non-perpendicular angles is increased, and (2) the distribution of non-perpendicular angles of incidence.

DETAILED DESCRIPTION OF THE PREFERRED EMBODIMENT

Figure 1A:
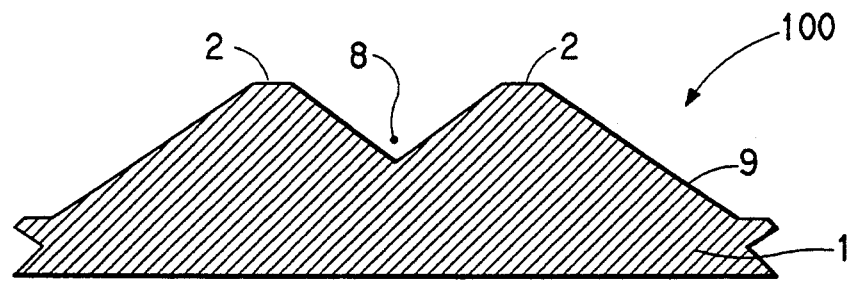
FIG. 1a and 1b are cross-sectional views depicting relief profiles obtained using exposure units of the prior art.

The present invention allows flexographic printing plates having desired relief profiles to be produced more quickly and uniformly. This is accomplished by (1) using a movable radiation source, (2) moving the exposing source across the photosensitive material, (3) controlling the proportion of (a) radiation which strikes the photosensitive material with a perpendicular angle of incidence to (b) radiation which strikes the photosensitive material with non-perpendicular angles of incidence, such that the radiation having non-perpendicular angles is increased, and (4) controlling the distribution of non-perpendicular angles of incidence.

The radiation source is a single unit which is movable relative to the surface of the photosensitive material. It can be a single lamp, or a group of lamps that move as a unit. Thus the source provides a uniform exposure to the entire photosensitive material. The type of lamp chosen will depend on the composition and thickness of the photosensitive material. The radiation source must emit an effective amount of radiation having a wavelength which matches the absorption characteristics of the photosensitive material. Most photosensitive materials absorb in the region of 230 to 450 nm, and usually 340 to 400 nm, and radiation sources which emit in this region are well known. These include commercial ultraviolet fluorescent tubes, medium, high, and low pressure mercury vapor lamps, argon glow lamps, electronic flash units, photographic flood lamps, pulsed xenon lamps, carbon arc lamps, etc.

In a preferred embodiment, the radiation source is a single, high-intensity lamp. The term "high-intensity lamp" means a lamp having an input power of at least 50 W/linear inch and which provides a peak radiation intensity of at least 35 mW/cm$^2$ at the surface of the photosensitive element. By "peak radiation" it is meant the highest intensity radiation within the wavelength range to which the photosensitive material is sensitive, i.e., peak activating radiation. In practice, the radiation source is usually located at a distance of about 5 to 25 cm from the surface of the photosensitive element and lamps having an input power of 100 to 300 W/linear inch are generally acceptable. The peak intensity of the lamp should be at a wavelength which matches the absorption characteristics of the photosensitive material. As discussed above, this is generally in the region of 230 to 450 nm, and usually 340 to 400 nm.

High intensity lamps which are suitable for use in the exposure unit of the present invention include low and medium pressure mercury arc lamps and mercury arc metal halide lamps which are doped with additives. A preferred lamp is a medium pressure mercury arc lamp which is doped with an additive to increase the intensity of energy emitted in the 380 nm region. The use of the high intensity lamp results in shorter exposure times and thus increases productivity.

During the exposure step, the radiation source is moved relative to and either tangentially or in a plane parallel to the photosensitive material. By this it is meant that the radiation source and the photosensitive material are moved relative to each other in one of the following ways: the photosensitive material is stationary and the radiation source is moved; the radiation source is stationary and the photosensitive material is moved; or both are moved such that they also are moved relative to each other. The path that either or both of the radiation source and the photosensitive material move along is either tangential or parallel to the plane defined by the surface of the photosensitive material. In general it is preferred that the photosensitive material is stationary and the radiation source is moved over it. Hereinafter the embodiment in which the radiation source is movable will be discussed. But it will be understood that the alternative embodiments in which the photosensitive material is movable are also included. Additionally, it should be understood that the surface may be curved as in configurations where the photosensitive material is mounted in a rotating drum, in which case the exposure source moves tangentially relative to the material surface.

The velocity at which the radiation source moves, i.e., the scanning velocity, can be constant over the entire exposure or it can be varied. In some applications, particularly those in which very high intensity lamps are used and those requiring very high resolution, it can be advantageous to vary the scanning velocity with the radiation intensity or temperature of the source. This can be accomplished, for example, by using a photocell or thermocouple within the lamp housing in a feedback loop with the driving means which control the movement of the lamp. As the radiation intensity or temperature increases, the scanning velocity is also increased. It will be recognized that in some cases the efficiency of the radiation source may decrease with temperature, in which case the scanning velocity will be varied differently as a function of this temperature or radiation efficiency. The scanning velocity can also be varied with other variables.

In addition to using the movable radiation source described above, the radiation is controlled such that (1) the proportion of radiation which strikes the photosensitive material with non-perpendicular angles of incidence is increased, and (2) a predetermined distribution of non-perpendicular angles of incidence is obtained.

In exposure units of the prior art, the radiation source has been commonly a bank of exposure lamps which effectively provide a plane of radiation. Other units are known to use a radiation source in which the emitted radiation is collimated, i.e., all the energy rays are parallel to within about 15°. In the former case, the energy rays strike the photosensitive material at a plurality of angles of incidence. In the latter case, substantially all the energy rays strike the surface of the photosensitive material within a narrow range of angles of incidence. When these exposure units are used to produce flexographic printing plates, the resulting relief images have the profiles shown in FIGS. 1a and 1b.

FIG. 1a shows the profile of a dot or line in a plate which was exposed with a plane of radiation. Printing plate 100 has dot or line 2 which is the actual printing surface, and is supported by shoulder 9 on the floor 1 of the plate. The depth of the relief 8 is fairly shallow. When plates having this type of relief profile are used to print, the dot or line generally has poor definition due to the shallow relief depth and this results in lower resolution in the printed image.

Figure 1B:
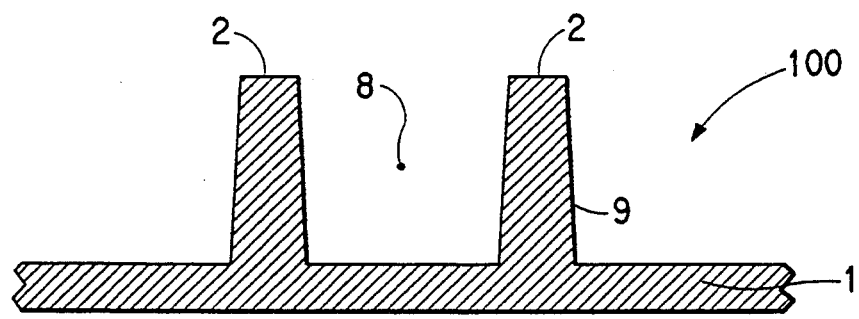

FIG. 1b shows the profile of a dot or line in a plate which was exposed with collimated radiation. The surface area of dot or line 2 and the depth of floor 1 are the same as in FIG. 1a. However, the relief depth 8 is dramatically increased and the shoulder 9 is dramatically decreased. In this case the dot or line has so little shoulder that isolated dots frequently do not even survive the development step, i.e., they are completely washed out. Dots and lines which are formed, frequently do not have enough integrity to withstand the printing process, i.e., they bend and do not impress the ink on the surface to be printed.

Figure 2:
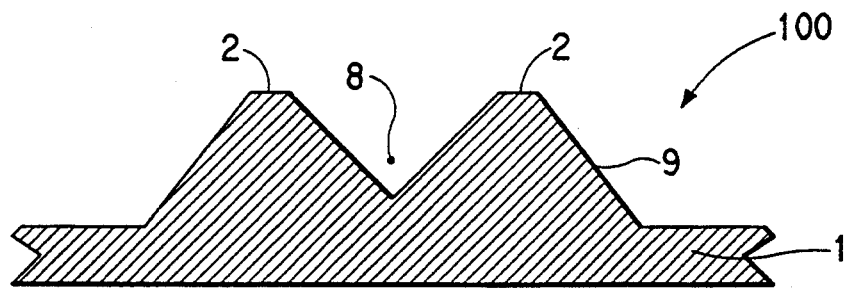
FIG. 2 is a cross-sectional view depicting a relief profile using an exposure unit of the present invention.

In the exposure unit of the invention, the exposing radiation is controlled and the exposing radiation strikes the photosensitive material at controlled angles such that the desired relief profile can be obtained. This is illustrated in FIG. 2. Again, the surface area of dot or line 2 and the depth of floor i are the same as in FIGS. 1a and 1b. However, there is also good relief depth 8 and at the same time a good supporting shoulder 9. This results in printed images with high resolution.

As stated above, in the exposure unit of the invention there are means for controlling (1) the proportion of (a) radiation which strikes the photosensitive material with a perpendicular angle of incidence to (b) radiation which strikes the photosensitive material with non-perpendicular angles of incidence, such that the radiation having non-perpendicular angles is increased, and (2) the distribution of non-perpendicular angles of incidence.

Figure 3:
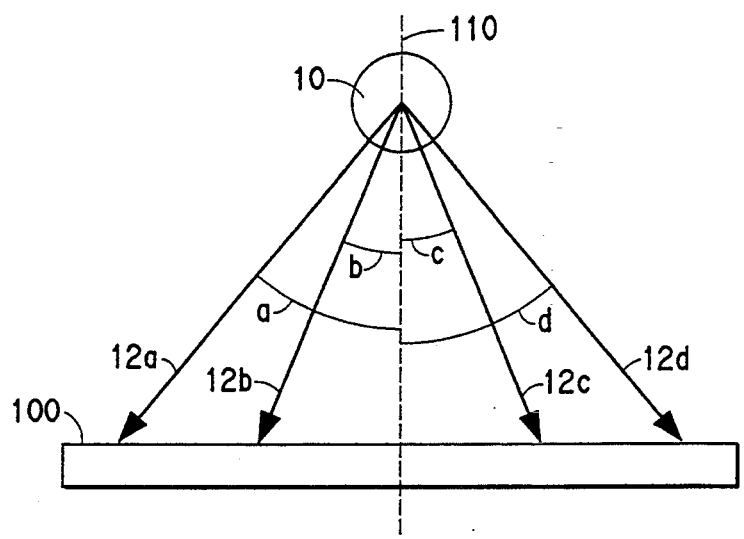
FIG. 3 is a schematic view showing actinic radiation from a radiation source striking photosensitive material a plurality of angles of incidence.

This can be understood more clearly by reference to FIG. 3. In this figure, printing plate 100 is struck by dominant radiation rays 12a, 12b, 12c, 12d, from radiation source 10. The angles of incidence are defined as the angle between the theoretical plane 110 which extends the length of the radiation source from the center of the radiation source perpendicular to the surface of the printing plate and the line of the radiation ray. Thus ray 12a has an angle of incidence indicated by a, etc. Rays which are parallel to plane 110 are perpendicular rays.

The controlling means in the exposure unit of the invention is used to increase the amount of energy which strikes the photosensitive material with non-perpendicular angles relative to the amount of energy which would have had struck the photosensitive material with non-perpendicular angles in the absence of the controlling means. Thus the light is positioned away from the perpendicular. In general, the relative proportion of perpendicular energy to non-perpendicular energy will be in the range of 2:1 to 1:4. In other words, the angular distribution of incident radiation is controlled such that the proportion of radiation not perpendicular to the plate surface is increased.

Furthermore, the controlling means in the exposure unit of the invention is used to control the distribution of the energy having non-perpendicular angles of incidence in order to produce the desired shoulder profile. By this it is meant that the amount of radiation at certain angles of incidence can be increased and the amount of radiation at other angles of incidence decreased. In general, for flexographic printing plates, it is desirable that a significant portion of the non-perpendicular radiation have angles of incidence between 30° and 60°. By "significant portion" it is meant at least 25%, and preferably at least 40% of the radiation strikes the photosensitive material at these angles of incidence, based on the total amount of non-perpendicular radiation. This results in printing plates having relief profiles approximately like those in FIG. 2. However, it will be understood that the desired distribution will be dependent upon the composition and thickness of the photosensitive material.

The means for controlling in the exposure unit of the invention is described in more detail below.

Photosensitive materials which can be used to prepare flexographic printing plates generally comprise a support and a photopolymerizable layer. The photopolymerizable layer comprises at least one elastomeric binder, at least one ethylenically unsaturated polymerizable or crosslinkable monomer, and a photoinitiator system. Such photosensitive elements are well known in the art and have been described in, for example, U.S. Pat. Nos. 4,323,636; 4,427,459; 4,430,417; 4,894,315; and 4,956,252, the disclosures of which are hereby incorporated by reference.

Printing reliefs can be made from the photosensitive elements by the steps of (1) exposing the element imagewise to actinic radiation to produce a difference in solubility between the exposed and non-exposed areas, (2) removing the more soluble areas with a developer solvent, and (3) drying the resulting plate. The process usually also includes exposing to a "backflash" exposure, (5) detackifying and (6) post-exposing overall.

The imagewise exposure is accomplished in the exposure unit of the invention. A mask of some type is placed on the surface of the photosensitive element so that only those areas corresponding to the desired printing surface are struck by actinic radiation. This is conventionally accomplished by placing a photographic transparency on the element, however, any means of providing a mask can be employed. The exposure time will depend on the intensity of the actinic radiation and the composition and thickness of the photopolymerizable material.

Photosensitive elements having a transparent support can also be given a backflash exposure. This is a short, overall exposure to actinic radiation through the support to sensitize the plate and establish a floor. The backflash exposure can occur before, during or after the imagewise exposure, but preferably occurs before. The exposure unit of the invention can be adapted to provide a backflash exposure, as will be described below, or the backflash can be carried out with a different exposure unit.

After the imagewise and backflash exposures the element is treated with a developer solvent to remove the more soluble unexposed areas of the photopolymerizable layer. The plate is then dried and optionally given a detackification exposure and/or overall post-exposure. Detackification exposures require exposure to radiation having a wavelength not longer than 300 nm, as disclosed in European Published Patent No. 0 017927. The post-exposure is an overall exposure to actinic radiation to ensure that the photopolymerization/photocrosslinking process is complete and that the plate will remain stable during printing and storage. The post-exposure step can be carried out in the exposure unit of the invention. Detackification exposure can also be carried out in the exposure unit of the invention provided that the radiation source emits an effective amount of radiation below 300 nm. Both the post-exposure and detackification exposure can also be carried out using a different exposure unit.

It will be understood that there are alternative processes for the preparation of flexographic printing plates and that the exposure unit of the invention can equally be used with these alternative processes. For example, the photosensitive material can be positive-working, i.e., the areas exposed to actinic radiation become more soluble; the non-image areas of the plate may be removed without the use of a developer; the photosensitive element may not have a support; the element can be exposed in the round, i.e., a non-planar configuration; and other embodiments.

Figure 4:
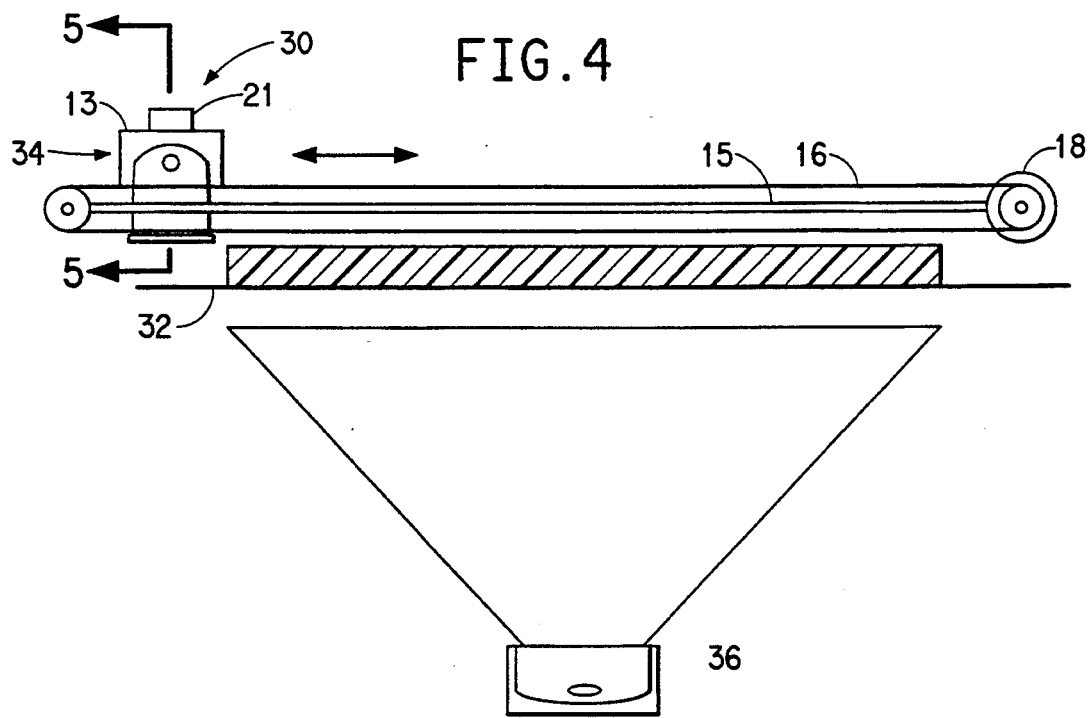
FIG. 4 is a cross-sectional schematic view of the exposure unit of the present invention.
Figure 5:
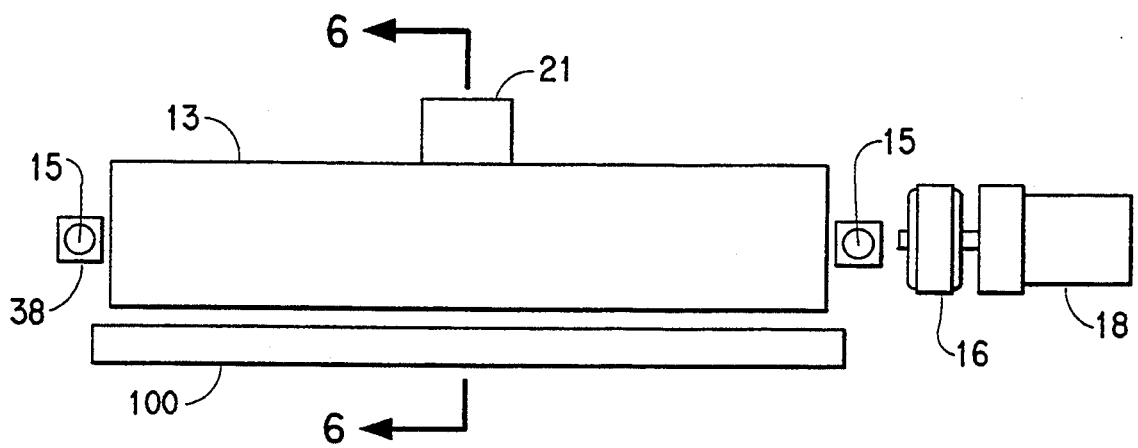
FIG. 5 is a cross-sectional schematic view of an imagewise exposing assembly of the exposure unit taken along line 5—5 of FIG. 4.
Figure 6:
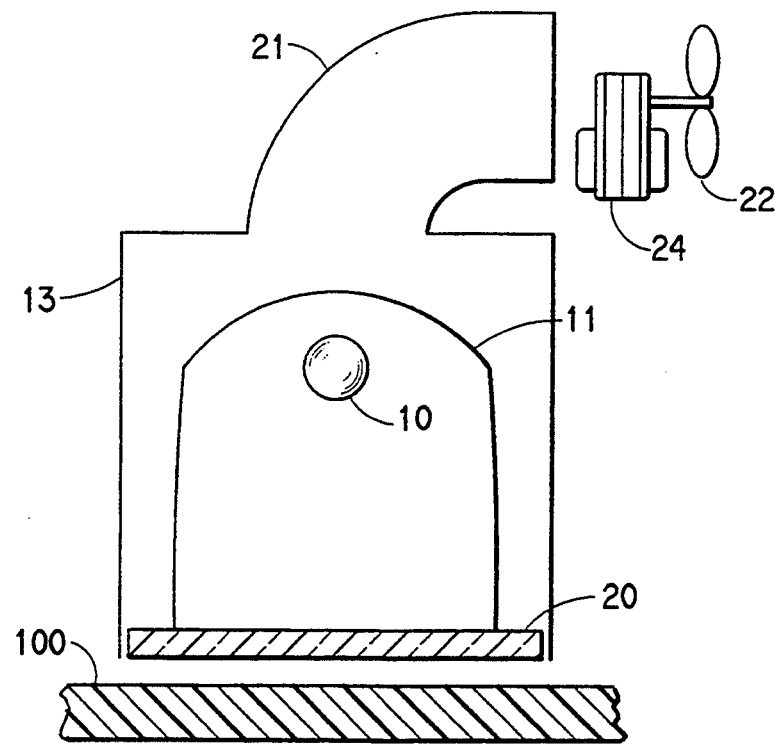
FIG. 6 is a cross-sectional schematic view of the imagewise exposure assembly taken along line 6—6 of FIG.

Referring to FIG. 4, an exposure unit 30 which includes a support member 32, an imagewise exposing assembly 34 and a backflash exposing assembly 36. The support member 32 supports a photosensitive material and is located between the imagewise exposing assembly and the backflash exposing assembly. It is understood that for the purpose of exposing the photosensitive material with the exposure unit, the photosensitive material with an imaged mask film and a vacuum draw down sheet (not shown) resides in a vacuum frame (not shown) as is conventional in the art. The support member 32 can be of any material suitable to support the photosensitive material in the frame. A preferred material for the support member 32 is glass, so that the photosensitive material can be easily exposed by the backflash assembly.

Referring to FIGS. 4 through 7, the imagewise exposing assembly 34 is a means for exposing a photosensitive material 100 to actinic radiation. The means for exposing includes a lamp housing 13 with a source of actinic radiation. The lamp housing 13 has a means for introducing cooling air inside the lamp housing for the purpose of removing heat generated by the source of radiation. Conventional means to cool the lamp housing 13 such as exhausting the heated air are suitable. Preferably, the lamp housing 13 is cooled by exhausting air through a port 21 in the lamp housing 13 with a ventilation fan 22 operated by a motor 24. The lamp housing 13 has a slot (not shown) which allows air intake into the housing 13 and prevents extraneous light from entering the lamp housing 13. Safety glass 20 is mounted on a bottom side in the lamp housing 13.

The source of actinic radiation is a lamp 10. Preferably one lamp is used a source of radiation, but it is possible that more than one lamp be used in the lamp housing 13 depending upon the size of the photosensitive material 100 being exposed. Various lamps having a plurality of spectral outputs can be employed depending on the sensitivity of the photosensitive surface. Mercury vapor lamps, and mercury vapor metal halide lamps which are doped with additives are examples of suitable radiation sources.

The lamp housing 13 also includes a means for controlling the desired angles of incidence 12 of the source of actinic radiation which expose the photosensitive material 100. The means for controlling may include reflectors, diffusers, and lenses. Preferably, the means for controlling is a reflector 11. The reflector 11 is mounted to sides of the lamp housing 13. It is well known within the skill of optics to design a light source/reflector assembly adapted to illuminate a surface from any number of desired angles. In the instant invention however, the reflector controls (1) the proportion of (a) radiation having perpendicular angles of incidence on a surface relative to (b) radiation having non-perpendicular angles of incidence on the same surface, such that the amount of radiation having non-perpendicular angles is increased, and (2) the distribution of non-perpendicular angles of incidence is constrained predominantly to a desired angular range. It is preferred that the amount of radiation having non-perpendicular angles is predominantly distributed between 30 and 60 degrees incidence on the surface. It should be understood that the term surface in the instant invention refers to a photosensitive surface and preferably a photosensitive surface that can be developed forming a relief image.

The imagewise exposing assembly 34 includes a means for moving the exposing means in a plane parallel to the surface being exposed. At each end of the lamp housing 13 are brackets 38 which suitably engage traverse rails 15. The traverse rails 15 are parallel. The means for moving include conventional actuators for transporting the lamp housing 13 on the traverse rails 15 across and above the photosensitive material 100, such as for example, chain drives, belt drive, cable, lead screw or linear motor. Preferably, the lamp housing 13 suitably engages a belt 16 coupled to pulleys. The belt 16 is driven by a motor 18 connected to a power source.

The backflash exposure assembly 36 can be conventional in the art, such as, for example, banks of fluorescent lamps, or may be similar to the imagewise exposure assembly described above. The backflash exposure assembly 36 primarily has the purpose of establishes the depth of the plate relief (floor) adapted to retain the dimensional stability and spatial relationship of the imaged relief regions exposed by the traversing exposure source. A backflash exposure may be used with photosensitive materials having a transparent support. Backflash generally uses a radiation source emitting a principal wavelength around 360 nm. The backflash exposure gives the photosensitive material a uniform and relatively short exposure through the support, thereby photocrosslinking binder and monomer in the floor region.

Figure 7:
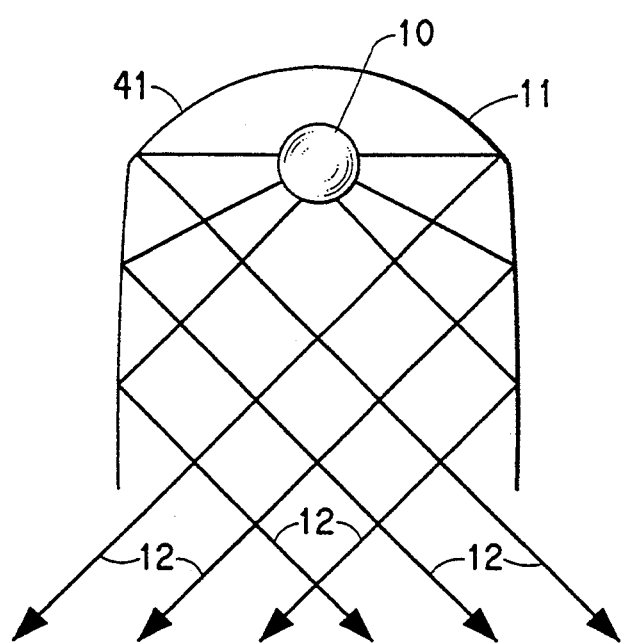
FIG. 7 is schematic cross-sectional view depicting the radial illumination output of the radiation source with a reflector used in the present invention.

FIG. 7 depicts a more detailed view of the reflector/lamp design. The lamp 10, which is preferably a medium-pressure additive-vapor mercury arc lamp, is tubular and is shown in cross-section to the length of the tube. It has a radial illumination output about this cross-section. The lamp 10 is fixed in a position relative to the average focus of the reflector 11. The reflector 11, which is also shown in cross-section to its length, is described as having an average focus, as opposed to an actual focus as in a parabolic reflector, due to its unique faceted 41 geometry which has been adapted to reflect the illumination emanating from the lamp 10 such that a desired proportion of the illumination is directed in a perpendicular (not shown) direction to an exposed surface, while the remaining portion of the illumination is reflected in a direction that is non-perpendicular 12 to the exposed surface. Furthermore, the non-perpendicular reflected illumination 12 is substantially constrained by the facets 41 such that the angle of incidence on the exposed surface is distributed to a range of angles, such as for example 30 to 60 degrees. It should be understood that these angles can also be attained with an interior surface texture of a reflector as well as with a continuous curve reflector, or a combination thereof.

We claim:

1. An exposure unit for imaging a photosensitive material comprising:
   means for exposing the photosensitive material to actinic radiation such that the radiation strikes the photosensitive material at a plurality of angles of incidence;
   means for moving the exposing means relative to and in a plane parallel to the photosensitive material; and
   means for controlling (1) the proportion of (a) radiation having perpendicular angles of incidence to (b) radiation having non-perpendicular angles of incidence, such that the radiation having non-perpendicular angles is increased, and (2) the distribution of non-perpendicular angles of incidence.

2. The exposure unit of claim 1 wherein the exposing means has a peak intensity greater than 35 mWatt/cm$^2$.

3. The exposure unit of claim 1 wherein the exposing means is selected from the group consisting of a mercury vapor lamp and a mercury-vapor metal halide lamp.

4. The exposure unit of claim 1 wherein the exposing means is movable and the photosensitive material is stationary.

5. The exposure unit of claim 1 wherein the controlling means is selected from the group consisting of reflectors, diffusers and lenses.

6. The exposure unit of claim 1 wherein the radiation having non-perpendicular angles of between 30 and 60 degrees is increased.

7. The exposure unit of claim 1 wherein the moving means travels at a non-constant velocity.

8. The exposure unit of claim 1 wherein the means for exposing is a single lamp.

9. A method for imaging a photosensitive material comprising:
   exposing imagewise the photosensitive material to actinic radiation from a radiation source such that the radiation strikes the photosensitive material at a plurality of angles of incidence, and at the same time moving the radiation source relative to and in a plane parallel to the photosensitive material; and
   controlling (1) the proportion of (a) radiation having perpendicular angles of incidence to (b) radiation having non-perpendicular angles of incidence, such that the radiation having non-perpendicular angles is increased, and (2) the distribution of non-perpendicular angles of incidence.

10. The method of claim 9 wherein the source has a peak intensity above 35 mWatt/cm$^2$.

11. The method of claim 9 wherein the photosensitive material is adapted for preparing a flexographic printing plate and comprises:
    at least one elastomeric binder;
    at least one ethylenically unsaturated monomer; and
    at least one photoinitiator.

12. The method of claim 9 further comprising:
    exposing the photosensitive material to a backflash exposure wherein the backflash exposure occurs before, during, or after exposing imagewise.

13. The method of claim 9 wherein the amount of radiation having non-perpendicular angles of between 30 and 60 degrees is increased.

* * * * *